(12) United States Patent
Reddy (10) Patent No.: US 9,106,266 B2
(45) Date of Patent: Aug. 11, 2015

(54) TRELLIS STATE BASED STOPPING CRITERION FOR TURBO-DECODING

(75) Inventor: Pallavi Reddy, Toulouse (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 43 days.

(21) Appl. No.: 14/004,818

(22) PCT Filed: Mar. 14, 2012

(86) PCT No.: PCT/EP2012/054493
§ 371 (c)(1),
(2), (4) Date: Oct. 9, 2013

(87) PCT Pub. No.: WO2012/123510
PCT Pub. Date: Sep. 20, 2012

(65) Prior Publication Data
US 2014/0035766 A1 Feb. 6, 2014

(30) Foreign Application Priority Data
Mar. 14, 2011 (EP) .................................... 11352004

(51) Int. Cl.
*H03M 13/00* (2006.01)
*H03M 13/37* (2006.01)
*H03M 13/29* (2006.01)

(52) U.S. Cl.
CPC ...... *H03M 13/3753* (2013.01); *H03M 13/2975* (2013.01)

(58) Field of Classification Search
CPC ..................... H03M 13/2975; H03M 13/3753; H03M 13/2714; H03M 13/2948; H03M 13/612; H03M 13/37; H03M 13/2957; H03M 13/296; H03M 13/3972; H03M 13/3723; H03M 13/3905; H03M 13/3955; H04L 1/0048; H04L 1/005; H04L 1/0055
See application file for complete search history.

(56) References Cited

U.S. PATENT DOCUMENTS

2004/0064778 A1* 4/2004 Widdup ......................... 714/758
2006/0156207 A1* 7/2006 Vithanage et al. ............. 714/792
2012/0204081 A1* 8/2012 Fresia et al. ................... 714/763

FOREIGN PATENT DOCUMENTS

EP    1 178 613    2/2002

OTHER PUBLICATIONS

Johnson, S. J., "Iterative Error Correction, Turbo. Low-Density Parity-Check and Repeat-Accumulate Codes", pp. 132-161, XP002657941, (2010).
International Search Report Issued May 31, 2012 in PCT/EP12/054493 Filed Mar. 14, 2012.
(Continued)

*Primary Examiner* — Guerrier Merant
(74) *Attorney, Agent, or Firm* — Oblon, McClelland, Maier & Neustadt, L.L.P.

(57) ABSTRACT

A stopping criterion for a turbo-coding method. The criterion is based on states of a trellis determined by forward-backward recursion. If, for at least one elementary decoding stage, a transition ending state of a previous symbol is found identical to a transition starting state of a current symbol, for every symbol of the block but a first one and a last one, the decoding path is considered as consistent, a hard decision on the extrinsic information is made, and the turbo-decoding stops.

11 Claims, 5 Drawing Sheets

(56) References Cited

OTHER PUBLICATIONS

Claude Berrou, et al., "Near Shannon Limit Error—Correcting Coding and Decoding : Turbo-Codes (1)", Proceedings of ICC', 1993, pp. 1064-1070.

L. R. Bahl, et al., "Optimal Decoding of Linear Codes for Minimizing Symbol Error Rate", IEEE Transactions on Information Theory, Mar. 1974, pp. 284-287.

Hye-Mi Choi, et al., "Low-Power Hybrid Turbo Decoding Based on Reverse Calculation", ISCAS, 2006, pp. 2053-2056.

U.S. Appl. No. 14/004,846, filed Sep. 12, 2013, Reddy.

* cited by examiner

TRELLIS STATE BASED STOPPING CRITERION FOR TURBO-DECODING

TECHNICAL FIELD

The present application relates to the field of turbo codes and more particular to turbo-decoding.

PRIOR ART

The turbo-codes were introduced by C. Berrou et al. in the seminal article entitled "Near Shannon limit error-correcting coding and decoding: Turbo Codes", Proceedings of ICC '93 pp. 1064-1070, have encountered since then widespread success. The remarkable performances of the turbo-codes in terms of bit error rate or BER (Bit Error Rate), close to those of random coding, are explained by the presence of one or more interleaver(s) between different elementary coders. They are used as error correcting codes in many digital communication standards.

In its most common form, a turbo-encoder can be regarded as a parallel or a serial concatenation of systematic elementary encoders separated by interleavers.

At the receiving side, turbo-decoding is achieved by an iterative process involving as many elementary decoders as the turbo-encoder has elementary encoders, each iteration improving the reliability of the decoded codeword.

Figure 1:
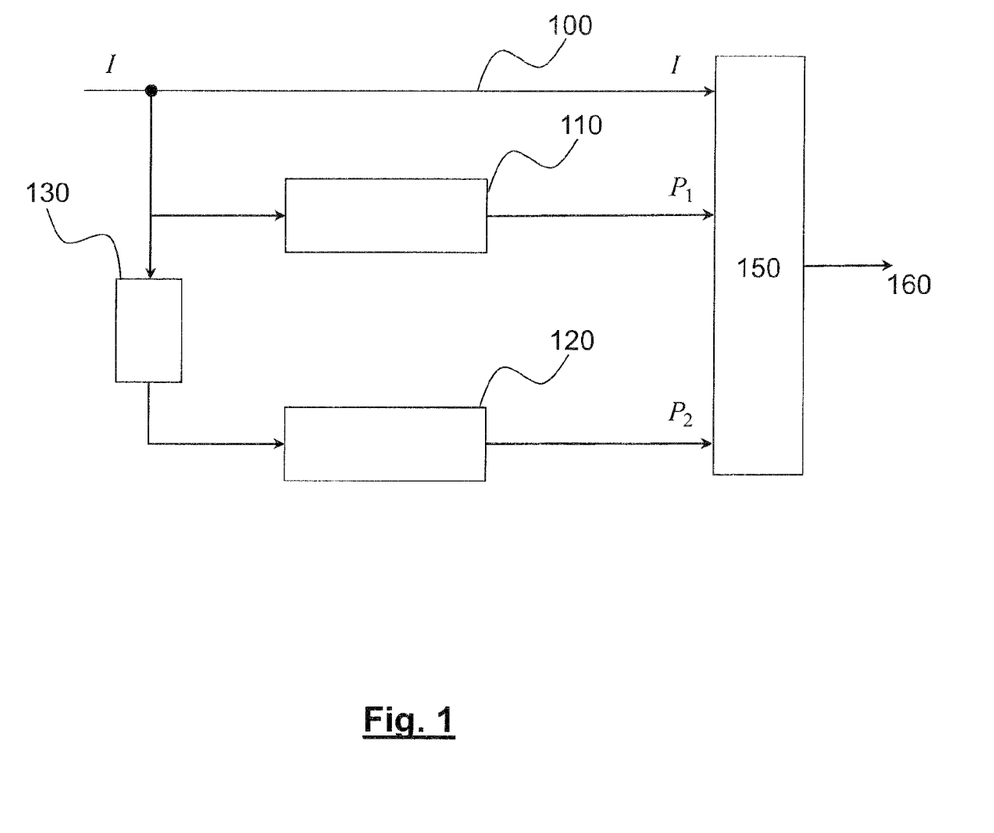
FIG. 1 schematically illustrates an example of turbo-encoder known from the prior art.

FIG. 1 illustrates an example of the structure of a turbocoder comprising two parallel concatenated elementary recursive systematic convolutional (RSC) encoders.

In this example, a block of information bits, I, are coded by two elementary encoders of the systematic convolutional type, arranged in parallel. Each elementary encoder is constituted by a (shared) systematic path, leaving by definition the information bits unchanged, and by a convolutional encoder. The first convolutional encoder 110 outputs parity bits $P_1$ as a function of the information bits I. The block of parity bits is hereafter referred to as the first redundancy part. Similarly, the second convolutional encoder 120 outputs second parity bits $P_2$ as a function of the information bits I previously interleaved by the interleaver 130. The block of parity bits $P_2$ is referred to as the second redundancy part.

The multiplexer 150 multiplexes the information bits I (systematic part) with the parity bits $P_1$ (first redundancy part) and $P_2$ (second redundancy part) before transmission over the communication channel 160. More specifically, the multiplexed bits are converted into M-ary symbols (where M is the cardinal of the modulation alphabet) prior to carrier modulation.

Figure 2:
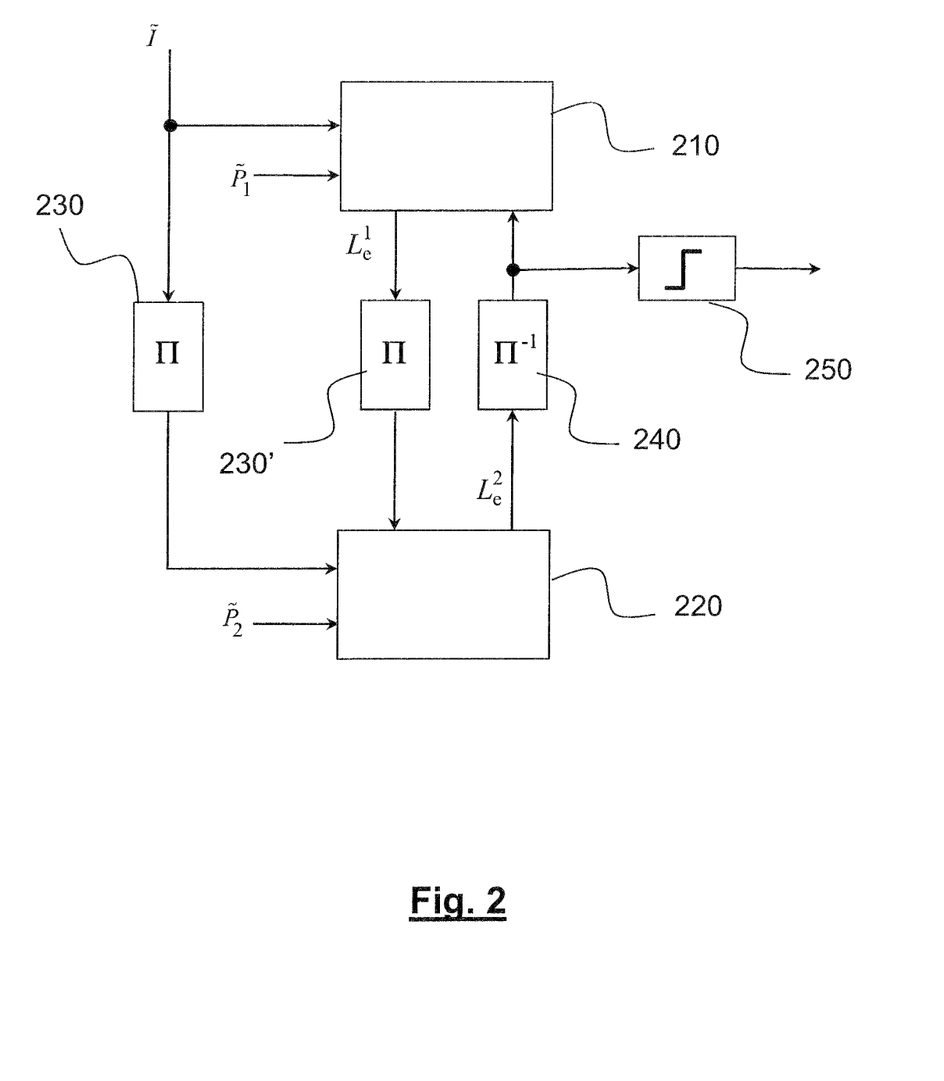
FIG. 2 schematically illustrates an example of turbo-decoder known from the prior art.
Figure 3:
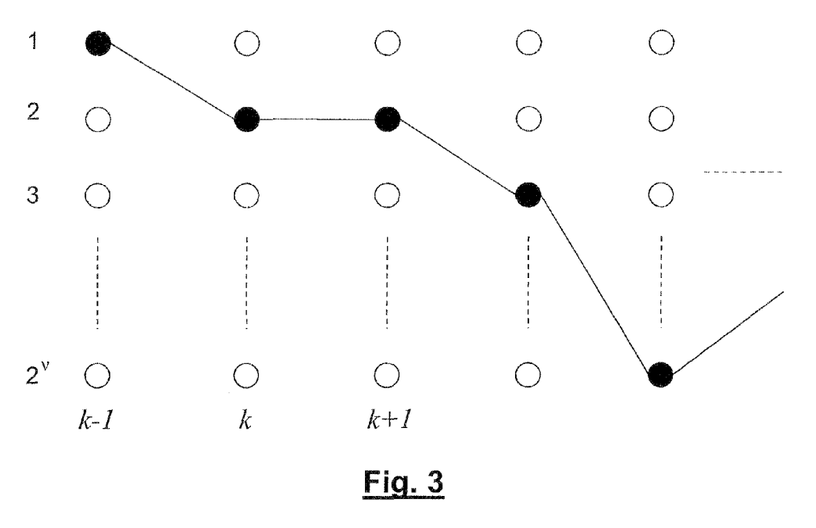
FIG. 3 schematically represents a coding path in a trellis of an elementary encoder.

FIG. 2 illustrates an example of turbo-decoder for decoding a block encoded by the turbo-encoder of FIG. 1.

The turbo-decoder comprises a first elementary decoder 210 corresponding to encoder 110, a second elementary decoder 220 corresponding to encoder 120. The decoders are of the SISO type (Soft In Soft Out) and may carry out the MAP (Maximum A posteriori Probability) decoding algorithm or one of its derivatives e.g. the Log-MAP or Max-Log-MAP decoding algorithm as known in the art.

The turbo-decoder receives from the symbol demodulator a noisy version of the information bits, the first parity bits and the second parity bits, respectively denoted $\tilde{I}$, $\tilde{P}_1$ and $\tilde{P}_2$. The systematic bits $\tilde{I}$ and first parity bits $\tilde{P}_1$ are supplied to the first elementary decoder 110. The first elementary decoder also inputs a priori information (also called extrinsic information) from the second elementary decoder.

Similarly, the second elementary decoder 220 inputs the received information bits $\tilde{I}$, after having being interleaved in interleaver 230, along with the received parity bits $\tilde{P}_2$. The second elementary decoder additionally inputs extrinsic information from the first elementary decoder after it has been interleaved in interleaver 230'. The interleavers 230 and 230' exhibit the same interleaving pattern $\Pi$ as interleaver 130. The extrinsic information provided by the second decoder is de-interleaved in de-interleaver 240 before being supplied to the first elementary decoder. The de-interleaver has the inverse interleaving pattern $\Pi^{-1}$ of interleaver 130.

The encoded block is subjected to iterative decoding, each decoding iteration comprising a first half-iteration in decoder 210 and a subsequent second half-iteration in decoder 220. The update and exchange of extrinsic information, i.e. of the extrinsic values relative to the different information bits, between the first and second elementary decoder, at each iteration, increases the reliability of the decoded block. It should be noted that the extrinsic information of the first decoder is initialized at values indicative of a lack of prior knowledge of bit reliability (0 if LLR values are used).

The extrinsic information is classically expressed in terms of soft values, e.g. LLRs (Log Likelihood Ratios) indicating the reliability of the decoding of each binary symbol. After completion of a given number of iterations or, more generally, when a predetermined stopping criterion is met, the decoding process is stopped and a hard decision is taken in 250 on the soft values to provide hard bit values. The hard decision is taken by performing a simple comparison with a given threshold (0 in case of LLR values).

The power consumption and the latency linearly depend upon the number of iterations of the decoder. It is therefore important to design an efficient stopping criterion, which does not lead to unnecessary iterations while simultaneously achieving a reasonable level of reliability of the decoded values.

Several stopping criteria have been proposed in the literature, based on soft and/or hard values.

US2007/0300139 discloses a stopping criterion based on the comparison of the LLR values output by an elementary decoder for two consecutive iterations. The implementation of such a stopping criterion requires however large storage capacity since a soft value (e.g. coded with a byte) has to be stored for each binary symbol of the block.

EP-A-1455457 further proposes to compare the minimum absolute value of the LLR values of an block with a given threshold. Once this minimum absolute value exceeds the threshold, the iterative decoding process is stopped. In other words, the decoding process stops when the reliability level of the less reliable bit is high enough.

In practice, this stopping criterion is quite sensitive to the threshold value. A too high threshold may result in a frequent rejection of correctly decoded blocks.

An alternative stopping criterion is based on the cross entropy of the LLR related to two consecutive iterations. This criterion is efficient but requires extra computation and considerable memory capacity.

Further stopping criteria are based on monitoring the sign changes in the extrinsic information related to two consecutive iterations. Indeed if a sign of a soft value oscillates from on iteration to the text, this indicates that the corresponding bit is not yet reliable. This stopping criterion requires considerable memory capacity, as the signs of the LLR values for at least two blocks of extrinsic information need to be stored.

The aim of the present invention is therefore to propose a new stopping criterion for a turbodecoding process, which is robust without needing computational overhead or large memory capacity.

DISCLOSURE OF THE INVENTION

The present invention is defined in the appended independent claims. Various advantageous embodiments are given in the dependent claims.

BRIEF DESCRIPTION OF THE DRAWINGS

The present invention will be better understood from the description of the following embodiments, by way of illustration and in no way limitative thereto.

DETAILED DISCLOSURE OF PARTICULAR EMBODIMENTS

We will consider again in the following a turbo-decoder for decoding blocks of binary symbols which have been encoded by a turbo-encoder. The term block can be construed here as a frame or a codeword. The binary symbols processed by the turbo-decoder are expressed in terms of soft values (soft information), typically in terms of LLRs as known in the art.

The turbo-encoder may be constituted by a plurality P of parallel or serially concatenated elementary coders or a combination of such serial and parallel concatenated elementary coders (hybrid turbocoder). Without loss of generality we will assume that the elementary coders are RSC (Recursive Systematic Convolutional) encoders. It will nevertheless be understood by the man skilled in the art that other types of encoders can be used while remaining in the scope of present invention.

The turbo-decoder is constituted by the same plurality P of elementary decoders and performs an iterative decoding process as set out above. It is recalled that each elementary decoder corresponds to an elementary encoder of the turbo-encoder and processes the same kind of information as the one output by the corresponding elementary encoder. More specifically, each elementary decoder inputs the systematic part of the received block (e.g. after propagation over the communication channel), possibly interleaved, and a redundancy part corresponding to the one generated by said elementary encoder. In addition, the elementary decoder receives extrinsic information from at least another elementary decoder. Each elementary decoder generates its own extrinsic information from the input systematic part, redundancy part and extrinsic information. The extrinsic information thus generated is supplied in turn to at least another elementary decoder.

Before describing the operation of an elementary decoder, we first consider the corresponding elementary encoder in the turbo-encoder. This elementary encoder, as any convolutional encoder, can be regarded as a finite state machine, the transitions of which are determined by the generator polynomial. If the memory of the encoder is of size v (v shift register stages), the finite state machine may take $2^v$ states, each state being defined by the contents of the memory. It should be noted that the various elementary encoders of the turbo-encoder may have different memory sizes (i.e. shift registers having different lengths) and hence different numbers of states.

Figure 4:
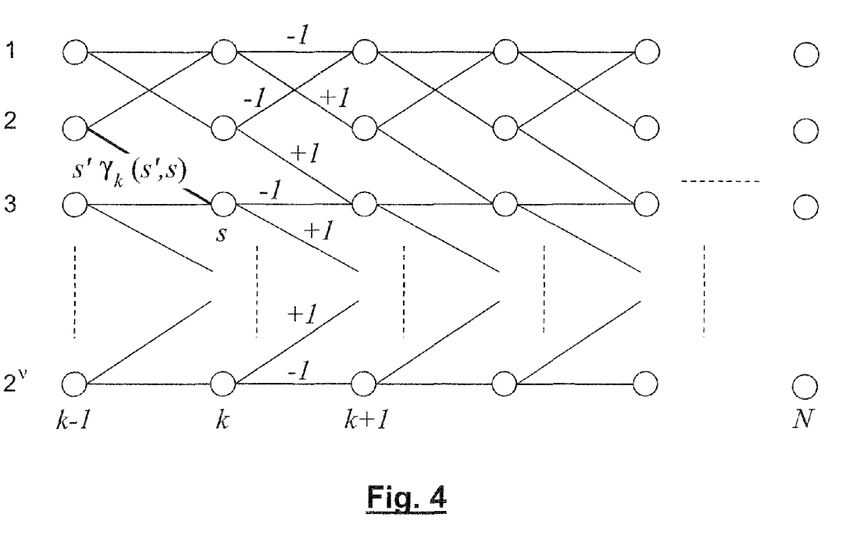
FIG. 4 schematically illustrates a trellis diagram used for in an elementary decoder of a turbo-decoder.

The coding operation may be regarded as a path in a trellis diagram as represented in FIG. 4.

Conventionally, the possible states of the encoder have been represented vertically by circles whereas the horizontal direction is the time axis. Each column of states corresponds to a clock cycle. At each input bit, on progresses rightwards in the trellis, and the encoder goes from a state a time k to a subsequent state at time k+1. The transition between the state at time k and the state at time k+1 is therefore represented by an edge in the trellis (and by an arc in the state diagram). The coding of a block of bits results therefore in a path within the trellis. At each time k, the encoder outputs a parity bit (in addition to the systematic bit) which depends upon the state of the encoder and the input bit.

The corresponding elementary decoder implements a forward-backward algorithm as know in the art. By forward-backward algorithm we mean here the MAP decoding algorithm or one of its derivatives such as the Log-MAP or the Max-Log-MAP algorithm. A description of the MAP algorithm can be found in the original paper of Bahl et al. entitled "Optimal decoding of linear codes for minimizing symbol error rate" published in IEEE Trans. on Information Theory, pp. 284-287, March 1974. A description of the Max-Log-MAP algorithm can be found e.g. in the article of C. Hye-Mi et al. entitled "Low power hybrid turbo decoding based in reverse calculation, ISCAS 2006.

The forward-backward algorithm is based on the same trellis as the coding trellis described above. More specifically, the forward-backward algorithm mainly comprises three steps: a forward recursion, a backward recursion and an extrinsic information (e.g. values) LLR calculation.

In the forward recursion, the algorithm recursively calculates the forward state probability of being in each state of the trellis at each time k given the knowledge of all the previous received symbols. The forward state probability, also called forward state metrics, is recursively obtained by:

$$\alpha_k(s) = \sum_{s'} \alpha_{k-1}(s')\gamma_k(s', s) \; k = 1, \ldots N-1 \tag{1}$$

where s is the current state and s' is the preceding state, $\alpha_{k-1}(s')$ is the forward state probability of being at state s' at time k−1, and $\gamma_k(s',s)$ is the branch probability of the transition between state s' and state s, given the received symbol, N is the size of the block. The state s' at the beginning of the transition s'→s will be referred to as the transition starting state whereas the state will be referred to as the transition ending state. The branch probability is also called the branch metrics.

The forward recursion is initialized by forcing the starting state to state 0 and setting:

$$\alpha_0(0)=1 \text{ and } \alpha_0(s)=0 \text{ for } s \neq 0 \tag{2}$$

Similarly, in the backward recursion, the algorithm recursively calculates the backward state probability of being in each state of the trellis at each time k given the knowledge of all the following symbols. The backward state probability, also called backward state metrics, is recursively obtained by:

$$\beta_{k-1}(s') = \sum_{s} \beta_k(s)\gamma_k(s',s) \quad k=N,\ldots,2 \quad (3)$$

The backward recursion is initialized by forcing the ending state to state 0 and setting:

$$\beta_N(0)=1 \text{ and } \beta_N(s)=0 \text{ for } s\neq 0 \quad (4)$$

The output LLR for each bit $u_k$ at time k is given by:

$$L(u_k) = \ln\frac{P(u_k=+1|y_k)}{P(u_k=-1|y_k)} = \ln\frac{\sum_{\substack{(s',s)\\u_k=+1}} \alpha_{k-1}(s')\gamma_k(s',s)\beta_k(s)}{\sum_{\substack{(s',s)\\u_k=-1}} \alpha_{k-1}(s')\gamma_k(s',s)\beta_k(s)} \quad (5)$$

where $y_k$ is the modulation symbol received on the communication channel at time k and where the bit values have been noted ±1. The upper summation in (5) is carried out over all branches with input label +1 and the lower summation is carried out over all branches with input label −1.

For an AWGN (Additive White Gaussian Noise) channel, the branch metrics $\gamma_k(s,s')$ can be obtained as:

$$\gamma_k(s',s) = \exp\left(-\frac{\|y_k - x_k\|^2}{2\sigma^2}\right) \quad (6)$$

where $\sigma^2$ is the noise variance and $x_k$ is the expected symbol for the transition s' to s.

The expressions (1)-(6) refer to the MAP algorithm. They can be simplified by using logarithmic values (Log-MAP algorithm) and even further simplified by retaining only the most significant values under the summation signs (Max-Log-MAP algorithm). In the latter case, denoting $\check{\rho}$ for ln ρ:

$$\check{\alpha}_k(s) = \max_{s'}\left[\check{\alpha}_{k-1}(s') + \check{\gamma}_k(s',s)\right] \quad (1')$$

$$\check{\alpha}_0(0) = 0 \text{ and } \check{\alpha}_0(s) = -\infty \text{ for } s \neq 0 \quad (2')$$

$$\check{\beta}_{k-1}(s') = \max_{s'}\left[\check{\beta}_k(s) + \check{\gamma}_k(s',s)\right] \quad (3')$$

$$\check{\beta}_N(0) = 0 \text{ and } \check{\beta}_N(s) = -\infty \text{ for } s \neq 0 \quad (4')$$

$$L(u_k) = \max_{\substack{(s',s)\\u_k=+1}}\left[\check{\alpha}_{k-1}(s') + \check{\gamma}_k(s',s) + \check{\beta}_k(s)\right] - \max_{\substack{(s',s)\\u_k=-1}}\left[\check{\alpha}_{k-1}(s') + \check{\gamma}_k(s',s) + \check{\beta}_k(s)\right] \quad (5')$$

$$\check{\gamma}_k(s',s) = -\frac{1}{2\sigma^2}[\|y_k\|^2 + \|x_k\|^2] + \frac{1}{\sigma^2}(y_k \cdot x_k) \quad (6')$$

As the first term between brackets is common to all branch metrics, it can be dropped for the purpose of calculating (1'), (3') and (5'), in other words:

$$\check{\gamma}_k(s',s) = \frac{1}{\sigma^2}(y_k, x_k) \quad (6'')$$

In expressions (6) or (6''), the only changing parameter is $x_k$. $x_k$ is a P+1 dimension vector (assuming one parity bit per elementary encoder), the elements of which are the systematic bit, denoted $x_k^s$ and the parity bits denoted $x_k^{rp}$, p=1, ..., P. The soft value of the systematic bit in (6) or (6'') is replaced by:

$$x_k^s = y_k^s + L_e(u_k) \quad (7)$$

where $L_e(u_k)$ is the extrinsic information provided from another elementary decoder. Therefore, the $\gamma_k(s',s)$ values can be calculated at each turbo-decoding iteration.

For the sake of simplification, we will now restrict the description to the Max-Log-MAP algorithm. The forward metrics for time κ−1 and the backward metrics for time κ can be calculated for each state:

$$\check{\alpha}_{\kappa-1}(s) = \max_{s'}\left(\sum_{k=0}^{\kappa-1} \check{\gamma}_k(s',s)\right) \quad (8)$$

$$\check{\beta}_\kappa(s) = \max_{s'}\left(\sum_{k=\kappa+1}^{N} \check{\gamma}_k(s',s)\right) \quad (9)$$

Referring to expression (5'), there is a single couple (s',s) of transition starting and ending states which maximizes $\check{\alpha}_{\kappa-1}(s') + \check{\gamma}_\kappa(s',s) + \check{\beta}_\kappa(s)|u_\kappa=1+$. This couple of states is denoted $(S'^{+1}_\kappa(i), S^{+1}_\kappa(i))$. It depends upon the values of $\check{\gamma}_k(s',s)$, k=0, ..., N which in turn depends upon the iteration i of turbo-decoding as these values are function of extrinsic information.

Similarly, there is a single couple of states (s,s') which maximizes $\check{\alpha}_{\kappa-1}(s') + \check{\gamma}_\kappa(s',s) + \check{\beta}_\kappa(s)|u_\kappa=-1$ in expression (5'). This couple of states is denoted $(S'^{-1}_\kappa(i), S^{-1}_\kappa(i))$ for the same reasons as those stated above.

Figure 5A:
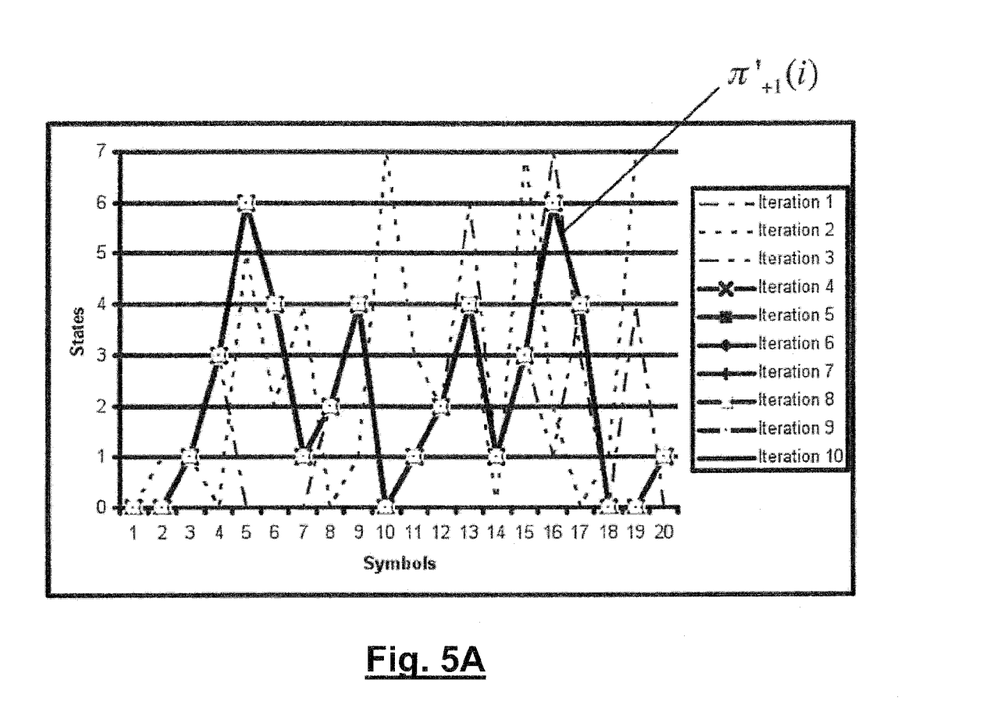
FIG. 5A represents a path in the trellis, going through transition starting states, for consecutive turbo-decoding iterations.

FIG. 5A illustrates a first path in the trellis, going through transition starting states $S'^{+1}_\kappa(i)$, κ=1, ..., N−1, for consecutive turbo-decoding iterations i. More specifically, for each turbo-decoding iteration i, a path $\pi'_{+1}(i)$ going through the states $S'^{+1}_\kappa(i)$, κ=1, ..., N of the trellis is determined for the elementary decoder considered.

Figure 5B:
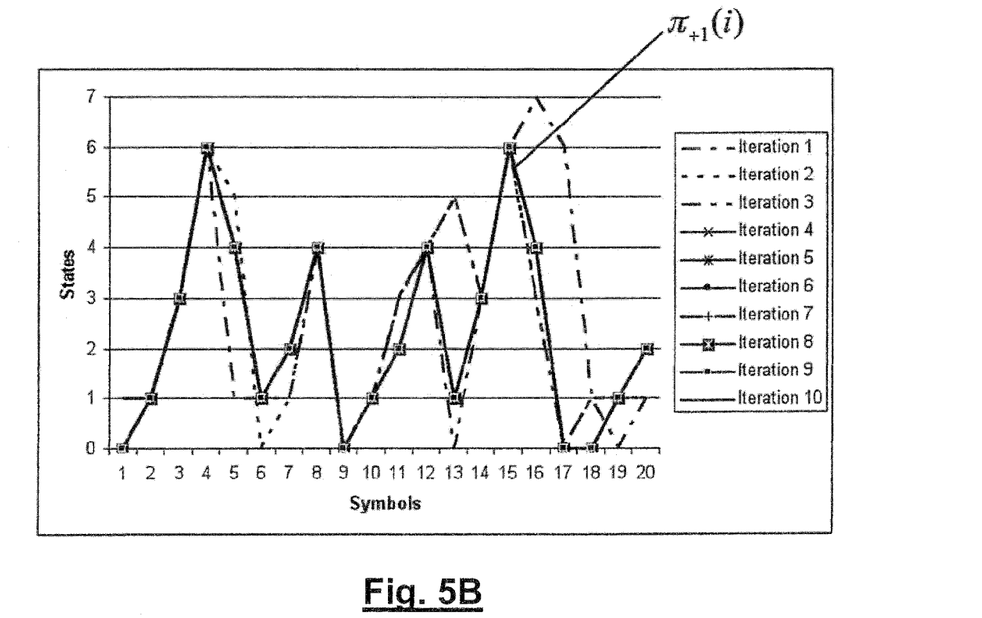
FIG. 5B represents a path in the trellis, going through transition ending states, for consecutive turbo-decoding iterations.

Similarly, FIG. 5B illustrates a second path in the trellis, going through transition ending states $S^{+1}_\kappa(i)$, κ=N, ..., 2, for consecutive turbo-decoding iterations i. More specifically, for each turbo-decoding iteration i, a path $\pi_{+1}(i)$ going through the states $S^{+1}_\kappa(i)$, κ=N, ..., 2 of the trellis is determined for the elementary decoder considered.

The paths $\pi'_{+1}(i)$ and $\pi_{+1}(i)$ are illustrated for 10 consecutive iterations of an 8 states elementary decoder and an AWGN channel with SNR=0.9 dB. As it can be noticed after 4 iterations, the two paths coincide but for a one symbol shift, that is:

$$S'^{+1}_\kappa(i) = S^{+1}_{\kappa-1}(i) \text{ for } \kappa=2,\ldots,N-1 \quad (10)$$

Condition (10) means that the transition starting state of the current symbol is the same as the transition ending state of the previous symbol. It expresses therefore the continuity relation along a coding path.

Alternatively, we may consider a third path $\pi'_{-1}(i)$ in the trellis, going through transition starting states $S'^{-1}_\kappa(i)$, κ=1, ..., N−1, and a fourth path $\pi_{-1}(i)$, going through transition ending states $S'^{-1}_\kappa(i)$, κ=1, ..., N−1. Again, after several iterations the two paths coincide but for a one symbol shift, that is:

$$S'^{-1}_\kappa = S^{-1}_{\kappa-1} \text{ for } \kappa=2,\ldots,N-1 \quad (11)$$

It can be shown that, if the turbo-decoding converges, the coincidence conditions (10) and (11) are met after the same number of iterations.

According to the invention, condition (10) or (11) is used as stopping criterion for the turbo-decoding iterations. The decisive advantage of such a criterion is that there is no need to compare values related to consecutive iterations (which would require a large memory capacity for the whole block) but values within a given iteration. The comparison can therefore be done on the fly with very little overhead.

Figure 6:
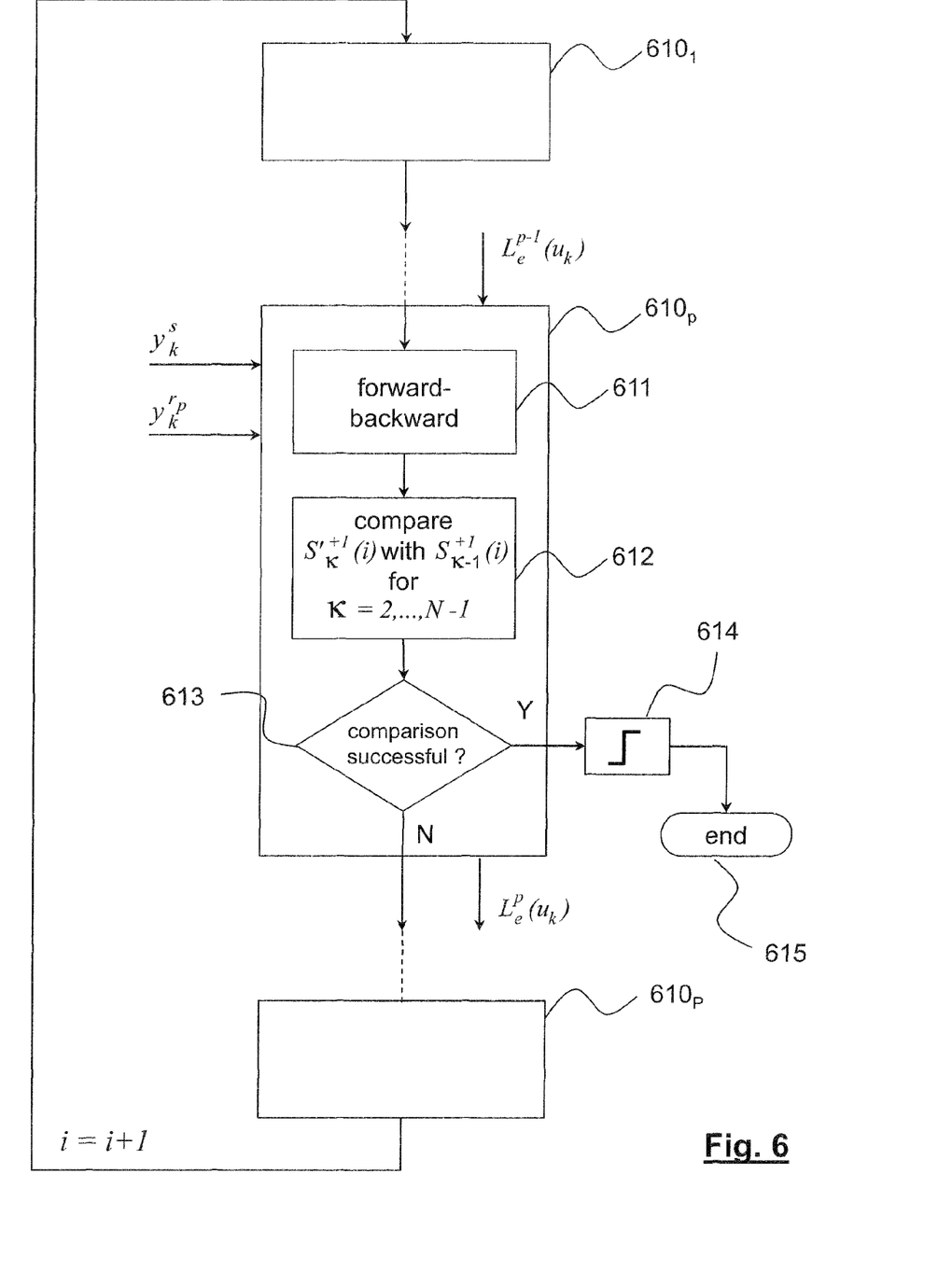
FIG. 6 schematically represents a flowchart of a turbo-decoding method using a stopping criterion according to an embodiment of the invention.

FIG. 6 schematically represents a flow chart of a turbo-decoding method using a stopping criterion according to an embodiment of the invention.

As already stated in the outset, the turbo-decoding method consists in a plurality of iterations, each iteration being subdivided into P decoding operations, $610_1, \ldots, 610_P$ sequentially performed by thee P elementary decoders.

The stopping criterion is implemented here in the $p^{th}$ decoder. More generally, it is implemented in at least one elementary decoder.

The $p^{th}$ decoder receives the systematic soft bits $y_k^s$ and the soft parity bits $y_k^{r_p}$ from the demodulator. It also inputs the extrinsic values $L_e^{p-1}(u_k)$ from the preceding decoder.

We consider here the $i^{th}$ turbo-decoding iteration. The decoding stage $610_p$ starts with a forward-backward recursion in 611. The forward-backward algorithm can be MAP, Log-MAP or Max-Log-MAP.

The transition starting state $S'_\kappa{}^{+1}(i)$ of the current symbol and the transition ending state $S_{\kappa-1}{}^{+1}(i)$ of the previous symbol are compared in 612 for $\kappa=2, \ldots, N-1$, i.e. for every symbol of the trellis (or equivalently for every clock cycle) except the first one and the last one.

According to a variant, the transition starting state $S'_\kappa{}^{-1}(i)$ of the current symbol and the transition ending state $S'_{\kappa-1}{}^{-1}(i)$ of the previous symbol are compared for every symbol of the trellis except the first one and the last one.

In 613, it is checked whether the number of coincidences (successful comparisons) is equal to N−2. In the negative, the turbo-decoding goes on with the next decoding stage $610_{p+1}$. In the affirmative however, the turbo-decoding exits in 614 and a hard decision is taken on the extrinsic values $L_e^p(u_k)$, $k=1, \ldots, N$. The turbo-decoding method finally stops at 615.

The trellis-state based stopping criterion described above merely requires storing the transition ending state of the current symbol (if one progresses rightwards in the trellis, according to a first variant) or the transition starting state of the current symbol (if one progresses leftwards in the trellis, according to a second variant). The stored transition state is retrieved and compared with the transition starting state of the next symbol (in the first variant) or with transition ending state of the previous symbol (in the second variant). Hence, in both variants, only v bits need to be stored, in contrast with the stopping criteria of the prior art according to which N extrinsic values of the systematic bits had to be stored.

The invention claimed is:

1. A turbo-decoding method for turbo-decoding a block of symbols having been coded by a turbo-encoder, the turbo-decoding comprising:
a plurality of iterations, each iteration comprising a plurality of decoding stages, each decoding stage being carried out by an elementary decoder corresponding to an elementary encoder of the turbo-encoder, each decoding stage performing a forward-backward recursion on a trellis of a corresponding encoder, the trellis representing different states of the encoder and transitions between the different states, each transition being defined by a starting state and by an ending state, each transition corresponding to a bit value input by the encoder and causing the encoder to output at least a parity bit used for generating a symbol of the block, a transition between a starting state and an ending state thereby associated with a symbol of the block;
wherein at least one of the decoding stages comprises:
a comparison in which a transition starting state of a current symbol of a forward recursion on the trellis is compared with a transition ending state of a previous symbol of a backward recursion on the trellis of a same iteration, the comparison being made for every symbol of the block except a first one and a last one;
if the comparison fails, the turbo-decoding iteration proceeds with a next decoding stage; and
if the comparison is successful, the turbo-decoding iterations are stopped.

2. A turbo-decoding method according to claim 1, wherein the transition starting state of the current symbol is compared with the transition ending state of the previous symbol for a transition corresponding to a bit value equal to one.

3. A turbo-decoding method according to claim 1, wherein the transition starting state of the current symbol is compared with the transition ending state of the previous symbol for a transition corresponding to a bit value equal to zero.

4. A turbo-decoding method according to claim 1, wherein the comparison stores the transition ending state of a symbol and retrieves it for comparing it with the transition starting state of a next symbol.

5. A turbo-decoding method according to claim 1, wherein the comparison stores the transition starting state of a symbol and retrieves it for comparing it with the transition state of the previous symbol.

6. A turbo-decoding method according to claim 1, wherein each decoding stage supplies extrinsic values of systematic bits to the next decoding stage and the last decoding stage supplies extrinsic values of the systematic bits to the first decoding stage.

7. A turbo-decoding method according to claim 6, wherein if the comparison is successful, a hard decision is taken on the extrinsic values supplied by the at least one decoding stage to provide hard decided systematic bits.

8. A turbo-decoding method according to claim 1, wherein the forward-backward recursion is performed according to a MAP decoding algorithm.

9. A turbo-decoding method according to claim 1, wherein the forward-backward recursion is performed according to a Log-MAP decoding algorithm.

10. A turbo-decoding method according to claim 1, wherein the forward-backward recursion is performed according to a Max-Log-MAP decoding algorithm.

11. A turbo-decoder for turbo-decoding a block of symbols having been coded by a turbo-encoder, comprising:
circuitry configured to perform
a plurality of iterations, each iteration comprising a plurality of decoding stages, each decoding stage being carried out by an elementary decoder corresponding to an elementary encoder of the turbo-encoder, each decoding stage performing a forward-backward recursion on a trellis of a corresponding encoder, the trellis representing different states of the encoder and transitions between the different states, each transition being defined by a starting state and by an ending state, each transition corresponding to a bit value input by the encoder and causing the encoder to output at least a parity bit used for generating a symbol of the block, a transition between a starting state and an ending state thereby associated with a symbol of the block;

wherein at least one of the decoding stages comprises:
   a comparison in which a transition starting state of a current symbol of a forward recursion on the trellis is compared with a transition ending state of a previous symbol of a backward recursion on the trellis of a same iteration, the comparison being made for every symbol of the block except a first one and a last one;

if the comparison fails, the circuitry causes the turbo-decoding iteration to proceed with a next decoding stage; and if the comparison is successful, the circuitry causes the turbo-decoding iterations to stop.

\* \* \* \* \*